United States Patent
Blozinski et al.

(10) Patent No.: US 10,862,438 B1
(45) Date of Patent: Dec. 8, 2020

(54) FEED-FORWARD POWER AMPLIFIER WITH OFFLINE TUNING CAPABILITY

(71) Applicant: MOTOROLA SOLUTIONS, INC., Chicago, IL (US)

(72) Inventors: Mitchell R Blozinski, Lake In The Hills, IL (US); Niels-Henrik Lai Hansen, Frederiksberg (DK); Rodney W Hagen, Lake In The Hills, IL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 16/730,142

(22) Filed: Dec. 30, 2019

(51) Int. Cl.
| | |
|---|---|
| *H03F 1/32* | (2006.01) |
| *H04B 1/04* | (2006.01) |
| *H03F 3/24* | (2006.01) |
| *H03G 3/30* | (2006.01) |
| *H03G 3/10* | (2006.01) |

(52) U.S. Cl.
CPC .......... *H03F 1/3229* (2013.01); *H03F 3/245* (2013.01); *H03G 3/3042* (2013.01); *H04B 1/0475* (2013.01); *H03F 2200/231* (2013.01); *H03F 2200/321* (2013.01); *H03F 2200/396* (2013.01); *H03F 2200/451* (2013.01); *H03F 2201/3215* (2013.01); *H03F 2201/3218* (2013.01); *H03G 2201/103* (2013.01); *H03G 2201/307* (2013.01); *H04B 2001/0408* (2013.01)

(58) Field of Classification Search
CPC .. H03F 1/3229; H03F 3/245; H03F 2200/231; H03F 2200/321; H03F 2200/396; H03F 2200/451; H03F 2201/3215; H03F 2201/3218; H03G 3/3042; H03G 2201/103; H03G 2201/307; H04B 1/0475; H04B 2001/0408
USPC .............................. 455/114.2–114.3; 330/151
See application file for complete search history.

(56) References Cited

U.S. PATENT DOCUMENTS

| | | | |
|---|---|---|---|
| 5,130,663 A | 7/1992 | Tattersall, Jr. | |
| 5,307,022 A | 4/1994 | Tattersall, Jr. et al. | |
| 5,491,454 A | 2/1996 | Matz | |
| 6,091,297 A | 7/2000 | Elia | |
| 6,255,903 B1 * | 7/2001 | Leffel | H03F 1/3235 330/151 |
| 6,674,324 B1 * | 1/2004 | Ocenasek | H03F 1/3235 330/149 |

* cited by examiner

Primary Examiner — Lee Nguyen
(74) Attorney, Agent, or Firm — John MacIntyre

(57) ABSTRACT

A method and base station transmitter for providing offline tuning of a base station transmitter. The base station transmitter includes a feed-forward power amplifier comprising a Radio Frequency (RF) input and an RF output. The base station transmitter also includes a simulated carrier generator operatively coupled to the feed-forward power amplifier prior to the carrier cancellation loop. The simulated carrier generator provides a simulated carrier signal including one or more individual carrier frequencies to the RF input. The base station transmitter also includes a processor that is operatively coupled to the feed-forward power amplifier and the simulated carrier generator. The processor performs tuning of a carrier cancellation loop using the simulated carrier signal when the processor determines that a carrier signal is not present.

14 Claims, 4 Drawing Sheets

200

FEED-FORWARD POWER AMPLIFIER WITH OFFLINE TUNING CAPABILITY

BACKGROUND OF THE INVENTION

Feed-Forward Power Amplifiers (PA) require very accurate internal tuning in order to operate properly. The internal tuning can relate to linearity correction or power efficiency, for example. In current feed-forward PAs, this tuning requires the presence of input carriers to the PA.

Conventional Land Mobile Radio (LMR) applications have very dynamic transmitter carrier conditions, which include long periods of time where there are no carrier(s) present. Since there can be long periods of time with no carrier(s) present, Feed-Forward PAs cannot support conventional LMR, as the required tuning could not be maintained during these periods where no carrier(s) are present.

Therefore a need exists for a LMR feed-forward PA that can be accurately tuned in the absence of an input carrier.

BRIEF DESCRIPTION OF THE SEVERAL VIEWS OF THE DRAWINGS

The accompanying figures, where like reference numerals refer to identical or functionally similar elements throughout the separate views, which together with the detailed description below are incorporated in and form part of the specification and serve to further illustrate various embodiments of concepts that include the claimed invention, and to explain various principles and advantages of those embodiments.

Figure 1:
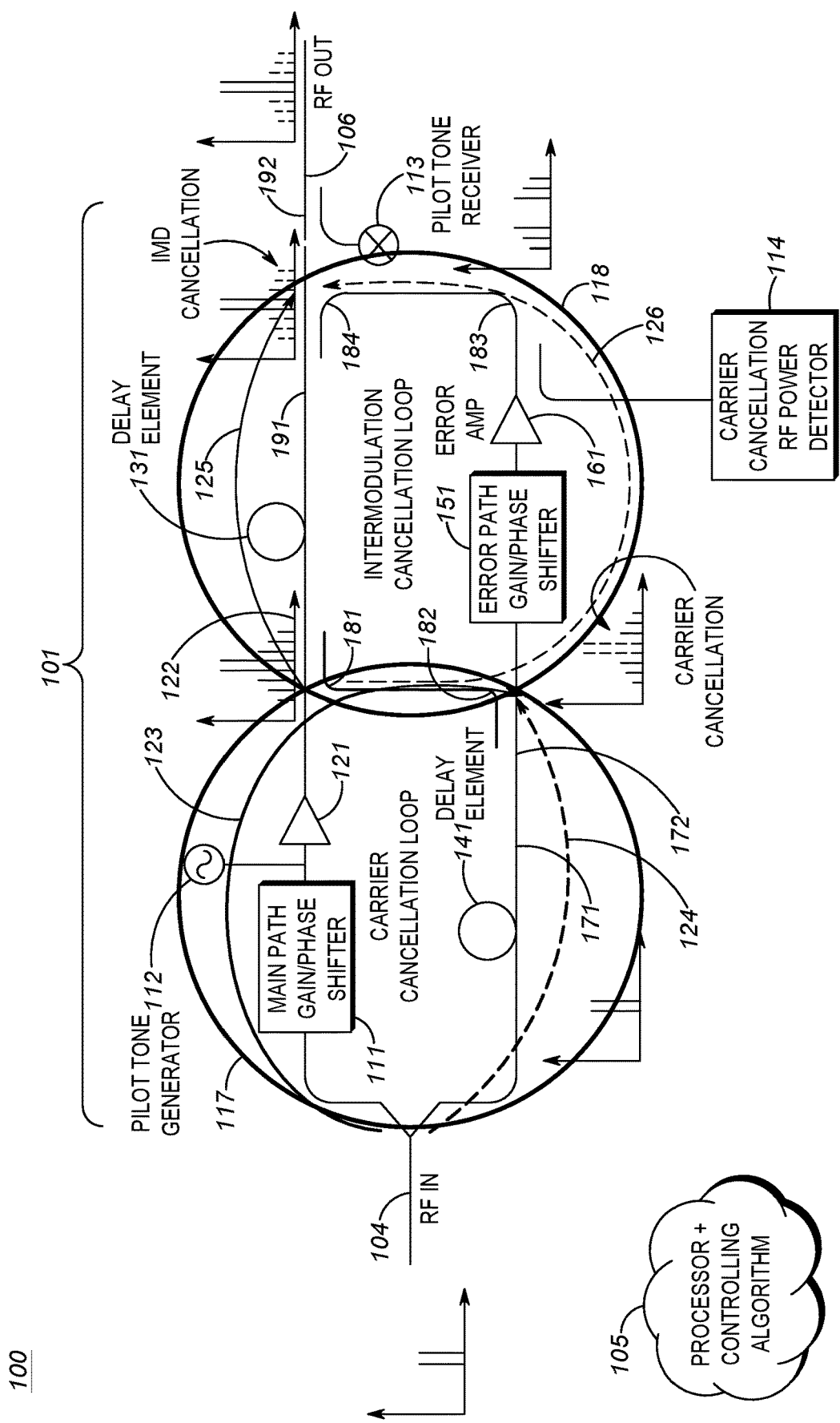
FIG. 1 depicts a simplified block diagram of an exemplary feed-forward power amplifier.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Power amplifiers create distortion to the input carrier signal or signals which are being amplified. There are numerous transmitter architectures and methods for correcting for this distortion, commonly referred to as linearization or correction, with varying tradeoffs between the different linearization techniques.

One such linearization architecture is based on Feed-Forward PAs. Feed-Forward PAs have been commonly used in cellular base stations for decades. The instantaneous operational correction bandwidth of the Feed-Forward PA makes it well suited for such an application. With cellular carriers always present and the PAs constantly transmitting the carrier signal, the Feed-Forward PA tuning can easily be maintained over time.

Feed-Forward PAs are not well suited for use in LMR applications due to the dynamic nature of the carrier signals, in particular for conventional radio systems. These radio systems can undergo long periods of time where there are no carriers present. Since Feed-Forward PAs utilize the input carriers themselves in order to perform the linearization tuning of the PA, and this tuning being extremely sensitive to operating frequency and temperature of the components within the PA, the tuning cannot be maintained adequately during these periods of time when no carriers are present. Due to the mission critical nature of LMR, the linearity of the one or more carriers must be maintained in order to allow for regulator compliant transmissions in a timely manner.

For adequate carrier cancellation for LMR applications, some of which requiring of up to 30 dB minimum cancellation, gain must be controlled to fractions of a dB and phase to within about 1 degree within the PA cancellation loops. Self-heating effects of a PA alone can result in a change of amplifier characteristics resulting in a change far exceeding these tolerances required for necessary tuning.

Disclosed herein are apparatus and methods for a feed-forward power amplifier (PA) with tuning capability when no carriers are present. The disclosed invention comprises a feed-forward PA with a simulated carrier generator operatively coupled to the PA RF input prior to the carrier cancellation loop. A processor operatively coupled to the power amplifier that controls the simulated carrier and performs the tuning of the PA using the simulated carrier when tuning is required in the absence of actual carrier signals.

Further disclosed are advanced tuning methods used in conjunction with the PA tuning elements in order to achieve rapid convergence of the Feed-Forward PA tuning using this simulated carrier. This is particularly advantageous in LMR systems where carrier signal transmission delays are detrimental to the operation of the system. Further benefiting from a rapid tuning convergence is the operating power efficiency of the transmitter, since Feed-Forward PAs are inherently very inefficient and consume significant power when operating. Minimizing the tuning time when the amplifier is otherwise in a non-transmitting state can result in significant power savings.

FIG. 1 depicts a prior art of an exemplary high-level block diagram of a feed-forward PA 100. The feed-forward PA 100 comprises two inner loops: a first loop being the Carrier Cancellation Loop 117, and a second loop being the Intermodulation (IMD) Cancellation Loop 118.

The Feed-Forward PA 100 comprising core elements 101 including Main Path Gain/Phase Shifter 111, Main Amplifier 121, Carrier Cancellation Loop Delay Element 141, IMD Cancellation Loop Delay Element 131, Error Path Gain/Phase Shifter 151, Error Amplifier 161, Pilot Tone Generator 112, Pilot Tone Receiver 113, Carrier Cancellation RF Power Detector 114, Main Path Carrier Cancellation Coupler 181, Clean Path Carrier Cancellation Coupler 182, IMD Cancellation Coupler 184, IMD Cancellation Summing Node 191, Linearized PA Output Signal 192, Carrier Cancellation Summing Node 171, and Carrier Cancelled Error Signal 172.

Figure 2:
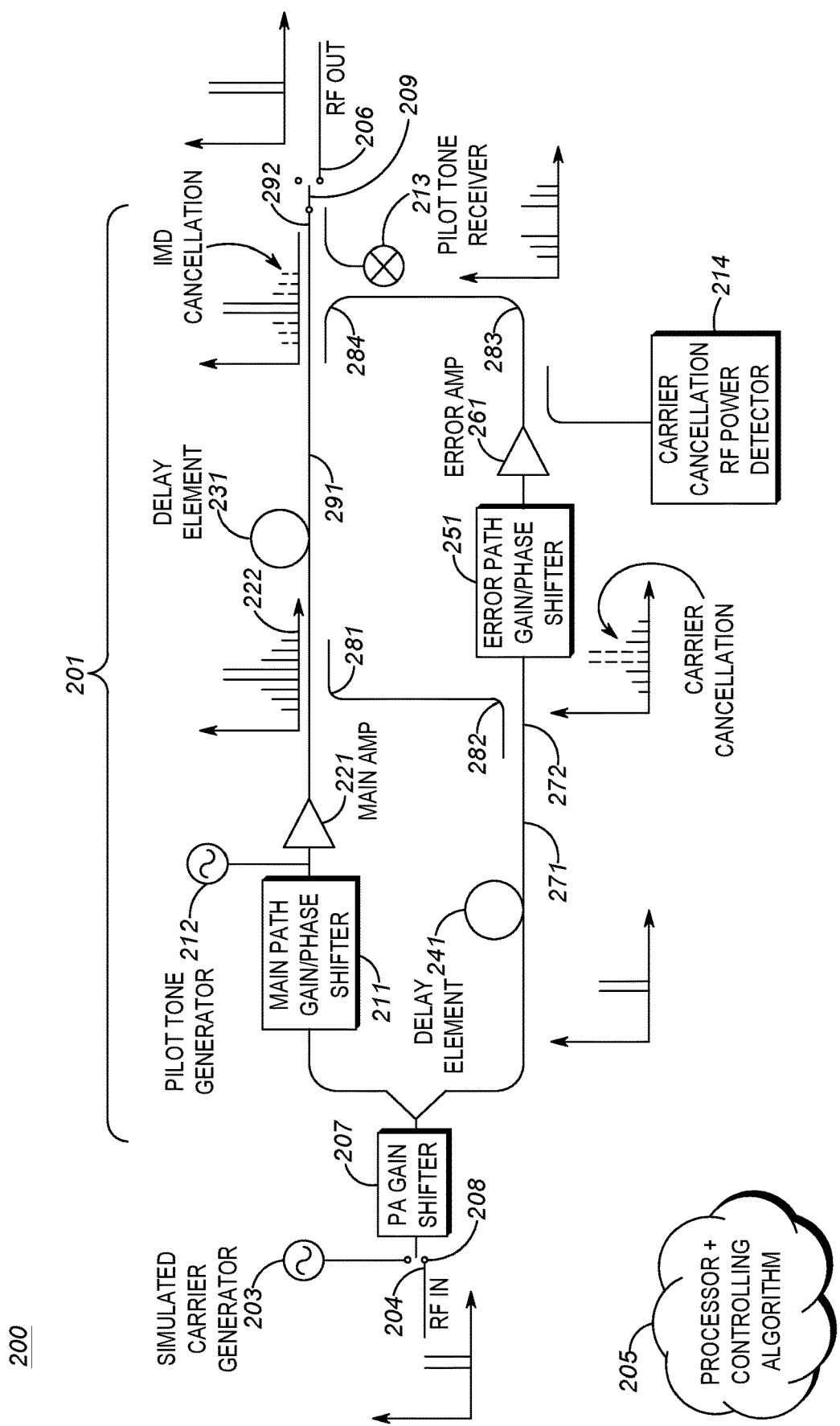
FIG. 2 depicts a simplified block diagram of a feed-forward power amplifier in accordance with an exemplary embodiment of the present invention.

The Feed-Forward PA 200 of FIG. 2 depicts elements pertaining to an exemplary embodiment. Feed-Forward PA 200 preferably comprises simulated carrier generator 203, PA gain shifter 207, input switch 208, and output switch 209. These elements as it pertains to the disclosed exemplary embodiment will be described, but first a high level operational overview of feed-forward PA 200 is provided. It is appreciated that one trained in the art will understand the basic operation of a feed-forward PA; this basic operational summary is provided herein with reference to elements common to those used in particular by the disclosed invention. One trained in the art will also appreciate that the location of the individual elements within each of the correction loops of PA 100 and PA 200 are exemplary and not limiting, and that certain elements can be arranged differently without deviating from the Feed-Forward architecture.

Feed-Forward PA 100 Carrier Cancellation Loop 117 preferably comprises two paths, main amplifier path 123 and delay path 124, commonly referred to as the "clean path". Main amplifier path 123 is comprised primarily of Main Path Gain/Phase Shifter 111, Main Amplifier 121, Main Path Carrier Cancellation Coupler 181, and Clean Path Carrier Cancellation Coupler 182. Clean path 124 is primarily comprised of Delay Element 141, where Delay Element 141 preferably closely matches the group delay of the two paths comprising Carrier Cancellation Loop 117 with minimal delay error in order to achieve optimal operational bandwidth.

IMD Cancellation Loop 118 preferably comprises two paths, error amplifier path 126 and delay path 125. Error amplifier path 126 is comprised primarily of Error Path Gain/Phase Shifter 151, Error Amplifier 161, and IMD Cancellation Coupler 184. Delay path 125 is primarily comprised of Delay Element 131, where Delay Element 131 provided in IMD cancellation loop 118 preferably closely matches the group delay of error amplifier path 126 of IMD cancellation loop 118 to the group delay of the delay path 125 of IMD cancellation loop 118 with minimal delay error in order to achieve optimal operational bandwidth.

RF Input signal 104 is operatively coupled to both paths of carrier cancellation loop 117. Main amplifier path 123 receives the coupled signal from RF input signal 104 and generates an amplified RF signal 122 in an amplified main path of power amplifier 100. Amplified signal 122 is then operatively coupled to Carrier Cancellation summing node 171 via the coupled path comprising carrier cancellation couplers 181 and 182. Clean path 124 includes Delay Element 141 provides a time-delayed version of RF signal 104 at Carrier Cancellation summing node 171. The resulting signal 172 is the output signal of Carrier Cancellation loop 117.

During the tuning operation of carrier cancellation loop 117 performed by processor 105, the phase and gain of the signal coupled from amplified RF signal 122 to Carrier Cancellation summing node 171 is preferably adjusted using Main Path Gain/Phase Shifter 111. This tuning is performed such that the resulting signal coupled from Main Amplifier Path 123 to Carrier Cancellation Summing Node 171 is at a substantially equal magnitude, and substantially 180 degrees apart from the time-delayed RF signal from clean path 124 through Delay Element 141 also coupled to Carrier Cancellation Summing Node 171. The feedback to processor 105 for determination during the tuning process is preferably supplied by Carrier Cancellation Power Detector 114, which is located in Error Amplifier Path 126 located after Carrier Cancellation Summing Node 171. The detected power of Carrier Cancellation Power Detector 114 is minimized when Carrier Cancellation Loop 117 is optimally tuned.

In accordance with an exemplary embodiment, Carrier Cancellation Summing Node 171 cancels or reduces carrier signal 104 from amplified RF signal 122 and provides an error signal 172 including the distortion components created by the Main Amplifier Path, but with reduced carrier signal component on the error amplifier path 126. Amplified signal 122 is the input RF signal to IMD Cancellation Loop 118, and derived from 122 is error signal 172 which is the input RF signal to the Error Amplifier 161.

Error Amplifier 161 amplifies this error signal 172 generated by the Carrier Cancellation Summing Node 171, to generate an amplified error signal 183 coupled to error cancellation coupler 184. Error cancellation coupler 184 couples amplified error signal 183 out of phase by "180" degrees with amplified RF signal 122 to cancel or reduce the distortions at RF output signal 192. The phase and gain of amplified error signal 183 can be adjusted using Error Path Gain/Phase Shifter 151. Delay element 131 in IMD Cancellation Loop delay path 124 is provided to preferably match the delay caused by error amplifier 161 and other components in the error amplifier path, for example, main path carrier cancellation coupler 181, clean path carrier cancellation coupler 171, and Error Path Gain/Phase Shifter 151.

In some embodiments, such as that shown in PA 100, one common approach for tuning IMD Cancellation Loop 118 is by using a Pilot Tone Generator (PTG) 112 and Pilot Tone Receiver (PTR) 113, both of which are controlled by processor 105. The tone injected by PTG 112 is introduced in main amplifier path 123 of Carrier Cancellation Loop 117, and as such can be acted upon by IMD Cancellation Loop 118 in order to perform tuning of the IMD Cancellation Loop. The tone frequency of these elements may be controlled to 'steer' it across various points of the desired tuning bandwidth.

During the tuning operation of IMD cancellation loop 118 performed by processor 105, the phase and gain of the signal coupled from 122 is adjusted using Error Path Gain/Phase Shifter 151. This tuning is performed such that the resulting error signal coupled from Error Amplifier Path 126 to IMD Cancellation Summing Node 191 is at a substantially equal magnitude, and substantially 180 degrees apart from the IM products of the time-delayed RF signal from IMD cancellation loop delay path 124 through Delay Element 131 also coupled to IMD Cancellation Summing Node 191. The feedback to the processor for determination during the tuning process is preferably supplied by Pilot Tone Receiver 113, which is located after IMD Cancellation Summing Node 191. Pilot Tone Receiver 113 is a tuned receiver, and is locked to the tone injected by Pilot Tone Generator 112. The detected signal from Pilot Tone Receiver 113 is minimized when IMD Cancellation Loop 118 is optimally tuned.

IMD Cancellation Summing Node 191 preferably cancels or reduces the intermodulation distortion created from Main Amplifier Path 123 of Carrier Cancellation Loop 117, primarily created by Main Amplifier 121, resulting in an amplified version of signal 104, with substantially reduced distortion components relative to amplified RF signal 122. The resulting signal is the linearized PA output signal 192.

In current Feed-Forward PAs, such as PA 100, although IMD Cancellation Loop 118 may be tuned without RF input carriers present, this is not the case for Carrier Cancellation Loop 117, which relies upon input carriers being present. Without input carriers present, there is not a stimulus for which the Carrier Cancellation loop may be tuned by processor 105.

In accordance with an exemplary embodiment, feed-forward power amplifier 200 includes simulated carrier generator 203 operatively coupled to RF input 204 of PA 200 to simulate an input carrier when actual carriers are not present. This simulated carrier allows PA 200 to properly tune carrier cancellation loop 217 when actual carriers are not present. Feed-forward power amplifier 200 preferably includes feed-forward elements 201, simulated carrier generator 203, and processor 205.

Processor 205 and its controlling algorithms preferably tunes Main Path Gain/Phase Shifters 211 to minimize RF Power detected at Carrier Cancellation RF Power Detector 214. In accordance with an exemplary embodiment, when actual carriers are not present, the simulated carrier produced by Simulated Carrier Generator 203 is used to provide the stimulus by which the carrier cancellation loop tune can then be maintained over time through tuning with simulated carriers generated via simulated carrier generator 203. In accordance with an exemplary embodiment, for adequate carrier cancellation for LMR applications which can require up to 30 dB minimum in some instances, gain must be controlled to fractions of a dB and phase to within about 1 degree.

In some exemplary embodiments, simulated carrier generator 203 comprises a single fixed-frequency tone, and may additionally be controlled by processor 205 to operate over a range of frequencies. In other exemplary embodiments, the simulated carrier comprises a swept frequency single tone. In yet other exemplary embodiments, the simulated carrier comprises a multiple tone generator, for example a comb generator. In at least some exemplary embodiments, the type of signal used for the simulated carrier may depend on the linearization required and instantaneous bandwidth requirements of PA 200.

Input signals coupled to the input path of PA 200 prior to the Carrier Cancellation Loop are preferably not corrected by the Feed-Forward linearization process. This preferably includes the simulated carrier generated by Simulated Carrier Generator 203. However, this may result in unwanted conducted spurious emissions from PA 200 conducted through PA output path 206.

In at least some exemplary embodiments, the resulting conducted spurious emissions may be sufficiently controlled by limiting the signal strength of the simulated carrier such that is at a substantially lower level than the actual input carriers. If this is not possible, other means are required to prevent these unwanted conducted emissions from the PA.

With the exemplary embodiment of FIG. 2, feed-forward power amplifier 200 includes an RF Output Switch 209. When the simulated carrier 203 is active, processor 205 controls the switch to decouple PA 200 from subsequent components in the RF network, decoupling output path 206 from power amplifier 200. When PA 200 is intended to perform amplification of the actual carriers, processor 205 controls RF Output Switch 209 to couple PA 200 back into the RF network, thus preventing unwanted conducted emissions from PA 200.

In further exemplary embodiments, PA 200 remains coupled to input carriers 208 at times when PA 200 is not intended to amplify the actual carriers and the actual carriers remain excited for use by PA 200 to perform tuning when not performing active carrier amplification and transmission. Processor 205 controls the output switch 209 to decouple PA 200 from subsequent components in the RF network, decoupling the output path from power amplifier 200. When PA 200 is intended to perform amplification of the actual carriers, processor 205 controls RF Output Switch 209 to couple PA 200 back into the RF network.

In further exemplary embodiments, Feed-Forward PA 200 is one of multiple Feed-Forward PAs configured in parallel, with an external RF splitter and RF combiner network to distribute RF power to and from the amplifiers. In at least some configurations, one or more of the power amplifiers may remain actively transmitting of actual carriers in the system, while one or more additional amplifiers may be offline and require tuning using the simulated carriers. The offline tuning of the amplifier(s) using the simulated carriers can interfere with the rest of the system in operation, and may include RF Input Switch 208 or RF Output Switch 209, which can be controlled by processor 205 to decouple the offline PAs from the rest of the RF network.

In accordance with an exemplary embodiment, processor 205 is implemented as a microprocessor with separate memory. In a further exemplary embodiment, processor 205 is implemented as a microcontroller or digital signal processor with memory on the same chip. In a further exemplary embodiment, processor 205 is implemented using multiple processors. In addition, processor 205 may be implemented partially or entirely as, for example, a field-programmable gate array (FPGA), an application specific integrated circuit (ASIC), and the like and the memory may not be needed or be modified accordingly. The memory can be, for example, non-transitory, computer-readable memory that stores instructions that are received and executed by processor 205 to carry out the functionality described herein. The memory may include, for example, a program storage area and a data storage area. The program storage area and the data storage area may include combinations of different types of memory, for example, read-only memory and random-access memory.

Processor 205 preferably includes a controlling algorithm to control frequency generator 203 to provide a simulated carrier when actual carriers 204 are not present. Processor 205 preferably also controls an output switch on PA 200 to prevent unwanted transmission of the simulated carrier by PA 200. The tuning using the simulated carriers may only be performed periodically, as required, in order to maintain proper tuning of the PA. The period which tuning occurs in absence of actual carriers can, for example, be dependent on conditions such as operating temperature of the hardware or carrier frequency.

Figure 3:
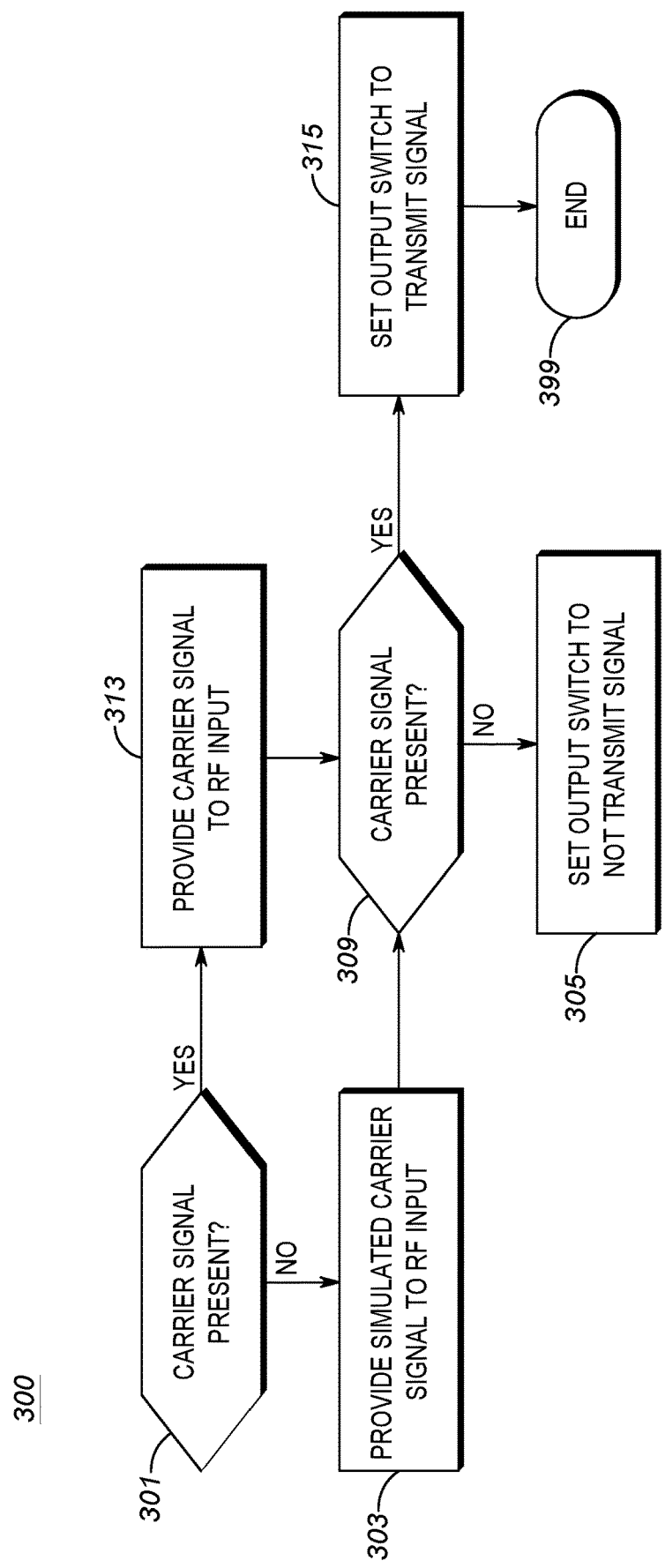
FIG. 3 depicts a flowchart in accordance with an exemplary embodiment of the present invention.

FIG. 3 depicts a flowchart 300 in accordance with an exemplary embodiment of the present invention. Processor 205 determines (301) if a carrier signal is present. If a carrier signal is present, the carrier signal is provided (313) to RF Input Signal 204.

If a carrier signal is not present as determined at step 301, Simulated carrier generator 203 provides (303) a simulated carrier signal to RF Input Signal 204. The provided signal, whether a carrier signal or a simulated carrier signal, goes through the feed forward tuning process within feed forward elements 201. Processor 205 determines (309) if the output signal was from a carrier signal. If so, processor 205 sets (315) the output switch to transmit the original signal. The process then ends (399).

If the signal was not from a carrier signal as determined at step 309, processor 205 sets (305) the output switch to not transmit the signal. In this scenario, the input signal was a simulated carrier signal, which was used to tune feed-forward PA 200. In this case, the output signal is not transmitted, but is preferably discarded.

In some embodiments, the tuning method performed by processor 205 using simulated carrier 203 is performed using advanced methods which result in rapid convergence of the Carrier Cancellation Loop or IMD Cancellation Loop. The required range and resolution of the gain and phase shifters of these loops can result in an exceedingly large combination of possible settings. For example, for a gain shifter and phase shifter each controlled with a 10 bit digital-to-analog (DAC) converter, this will result in over 1 million possible combinations of phase tuner and gain tuner settings which could be used by processor 205. Without advanced tuning methods, the time duration required for the processor to perform the tuning of the cancellation loop would be excessive.

Figure 4:
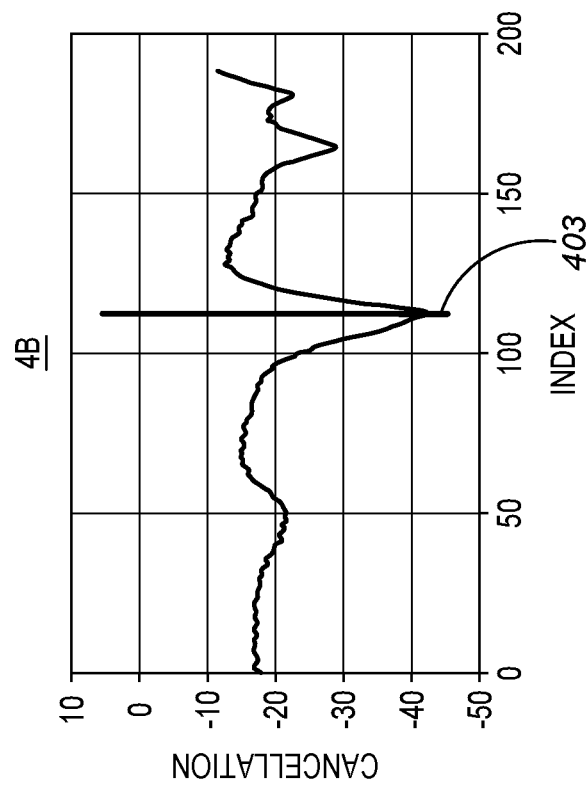
FIG. 4 depicts an exemplary advanced tuning method and cancellation response plot in accordance with an exemplary embodiment of the present invention.
Figure 4:
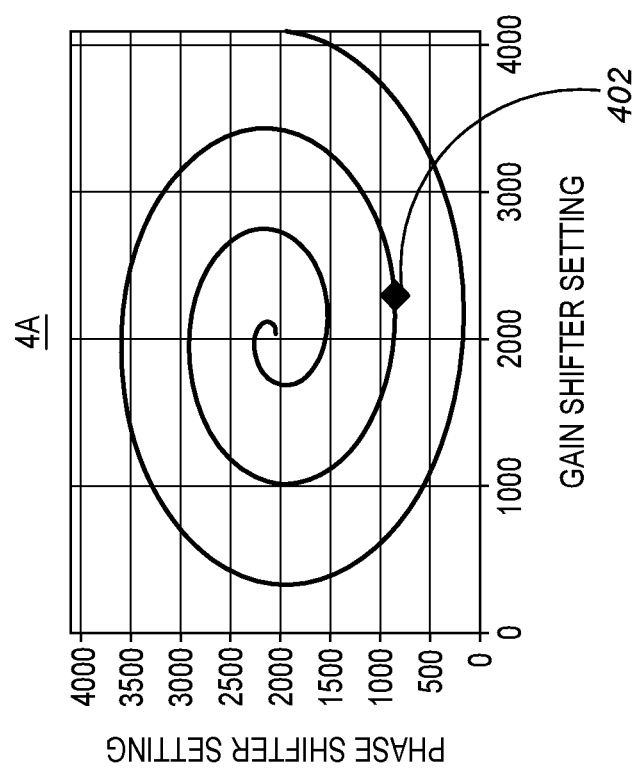

Using an advanced tuning method comprising a subset of predetermined pairings of fixed settings for the gain shifter and phase shifter, processor 205 can control the tuners across a small sub-set of possible settings, allowing very rapid convergence of the loop tuning. FIG. 4A depicts a plot in accordance with an exemplary invention for the curve from which the paired gain and phase tuner settings are included. Utilizing a total of 188 points, which is 0.02% of the total possible combinations for 10 bit DAC controlled gain and phase tuners, the processor can very quickly determine the near optimal settings for gain and phase tuners.

FIG. 4B depicts a cancellation curve response in accordance with this advanced tuning method, where the lower the value represents a higher level of cancellation. The point where cancellation is optimized is point 403, and corresponds to point 402 in FIG. 4A.

Using this advanced tuning method processor 205 can minimize the tuning time required for both the Carrier Cancellation Loop and the IMD Cancellation Loop. This minimized duration enables shorter delays to enable the power amplifier to be transmit-ready, and also minimizes the power consumption of the system required in order to perform this offline tuning. With the inefficiency of a Feed-Forward PA, this can result in hundreds of Watts of added power consumption during the offline tuning, versus tens of Watts during standby operation. Thus minimizing the duration of the offline tuning is also advantageous in power conscious systems.

Furthermore, when applying this advanced tuning method for tuning the Carrier Cancellation Loop, the RF gain of power amplifier 200 may change notably as a result of the main path gain shifter being controlled. This change in gain may result in undesirable system effects, for example in high output power to main amplifier 221. Further disclosed herein is inclusion of a PA gain shifter 207 located outside of the Feed-Forward Loops, and processor 205 controlling this gain shifter in a compensatory fashion to counteract the changes in gain resulting in changes to main path gain shifter 211. By adjusting PA gain shifter 207 to increase attenuation when main path gain shifter 211 is decreased in attenuation, and vice versa, the total through path gain can be maintained to a relatively consistent composite gain.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element preceded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized electronic processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising an electronic processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A base station transmitter comprising:
   a feed-forward power amplifier comprising a Radio Frequency (RF) input and an RF output;
   a simulated carrier generator operatively coupled to the feed-forward power amplifier, the simulated carrier generator providing a simulated carrier signal comprising one or more individual carrier frequencies to the RF input; and
   a processor operatively coupled to the feed-forward power amplifier and the simulated carrier generator, wherein the processor performs tuning of a carrier cancellation loop using the simulated carrier signal when the processor determines that a carrier signal is not present; and
   the base station transmitter further comprising at least one of:
      an output switch operatively coupled to the RF output, wherein the processor controls the output switch to not transmit an output signal when the carrier signal is not present; and
      an input switch controlled by the processor to operatively decouple the feed-forward power amplifier from the input carrier signal.

2. The base station transmitter of claim 1, wherein the simulated carrier signal is at a level that is substantially lower than the carrier signal.

3. The base station transmitter of claim 1, where the carrier cancellation loop comprises a first gain shifter and a first phase shifter and wherein the first gain shifter and the first phase shifter controlled by the processor are adjusted in paired movements.

4. The base station transmitter of claim 3, wherein a second gain shifter is located outside of the carrier cancellation loop and intermodulation cancellation loop, and wherein the second gain shifter controlled by the processor is adjusted in compensation for adjustment to the first gain shifter.

5. A method for providing offline tuning of a base station transmitter, the base station transmitter including a feed-forward power amplifier comprising a Radio Frequency (RF) input and an RF output, the method comprising:
   providing a simulated carrier signal comprising one or more individual carrier frequencies to the RF input; and
   tuning of a carrier cancellation loop using the simulated carrier signal when a processor determines that a carrier signal is not present; and
   the base station transmitter further comprising at least one of:
      an output switch operatively coupled to the RF output, wherein the processor controls the output switch to not transmit an output signal when the carrier signal is not present; and
      an input switch controlled by the processor to operatively decouple the feed-forward power amplifier from the input carrier signal.

6. The method of claim 5, wherein the simulated carrier signal is at a level that is substantially lower than the carrier signal.

7. The method of claim 5, where the carrier cancellation loop comprises a first gain shifter and a first phase shifter and wherein the first gain shifter and the first phase shifter are adjusted in paired movements.

8. The method of claim 7, wherein a second gain shifter is located outside of the carrier cancellation loop and an intermodulation cancellation loop, and wherein the second gain shifter is adjusted in compensation for adjustment to the first gain shifter.

9. The method of claim 8, wherein the first gain shifter and first phase shifter are controlled by the processor.

10. The method of claim 9, wherein the second gain shifter is controlled by the processor.

11. A base station transmitter comprising:
    a feed-forward power amplifier comprising a Radio Frequency (RF) input and an RF output;
    a simulated carrier generator operatively coupled to the feed-forward power amplifier, the simulated carrier generator providing a simulated carrier signal comprising one or more individual carrier frequencies to the RF input; and
    a processor operatively coupled to the feed-forward power amplifier and the simulated carrier generator, wherein the processor performs tuning of a carrier cancellation loop using the simulated carrier signal when the processor determines that a carrier signal is not present, where the carrier cancellation loop comprises a first gain shifter and a first phase shifter and wherein the first gain shifter and the first phase shifter controlled by the processor are adjusted in paired movements.

12. The base station transmitter of claim 11, wherein a second gain shifter is located outside of the carrier cancellation loop and intermodulation cancellation loop, and wherein the second gain shifter controlled by the processor is adjusted in compensation for adjustment to the first gain shifter.

13. A method for providing offline tuning of a base station transmitter, the base station transmitter including a feed-forward power amplifier comprising a Radio Frequency (RF) input and an RF output, the method comprising:
    providing a simulated carrier signal comprising one or more individual carrier frequencies to the RF input; and
    tuning of a carrier cancellation loop using the simulated carrier signal when a processor determines that a carrier signal is not present, where the carrier cancellation loop comprises a first gain shifter and a first phase shifter and wherein the first gain shifter and the first phase shifter are adjusted in paired movements.

14. The method of claim 13, wherein a second gain shifter is located outside of the carrier cancellation loop and an intermodulation cancellation loop, and wherein the second gain shifter is adjusted in compensation for adjustment to the first gain shifter.

* * * * *